United States Patent
Tsuria et al.

(10) Patent No.: US 6,424,947 B1
(45) Date of Patent: Jul. 23, 2002

(54) DISTRIBUTED IRD SYSTEM

(75) Inventors: Yossef Tsuria, Shoham; Yonatan Silver, Jerusalem, both of (IL)

(73) Assignee: NDS Limited, Middlesex (GB)

( * ) Notice: Subject to any disclaimer, the term of this patent is extended or adjusted under 35 U.S.C. 154(b) by 0 days.

(21) Appl. No.: 09/158,952

(22) Filed: Sep. 21, 1998

(30) Foreign Application Priority Data

Sep. 29, 1997 (IL) ................................................. 121862

(51) Int. Cl.⁷ .............................................. H04N 7/167
(52) U.S. Cl. .............................. 705/1; 705/26; 725/28; 725/6; 348/734
(58) Field of Search ............................... 705/1, 26, 72; 380/4, 227–233; 455/5.1; 725/6, 27, 30, 134, 87, 104; 348/552, 553, 563, 569, 734, 844

(56) References Cited

U.S. PATENT DOCUMENTS

| | | | |
|---|---|---|---|
| 4,748,668 A | | 5/1988 | Shamir et al. ............... 380/30 |
| 4,933,970 A | | 6/1990 | Shamir ...................... 380/30 |
| 5,282,249 A | | 1/1994 | Cohen et al. ............... 380/23 |
| 5,481,609 A | | 1/1996 | Cohen et al. ............... 380/16 |
| 5,603,078 A | * | 2/1997 | Henderson et al. .......... 455/5.1 |
| 5,619,250 A | | 4/1997 | McClellan et al. ........... 348/10 |
| D382,878 S | | 8/1997 | Erlin ...................... D14/218 |
| 5,666,412 A | | 9/1997 | Handelman et al. ........... 380/4 |
| 5,708,961 A | * | 1/1998 | Hylton et al. ............. 348/7 X |
| 5,767,896 A | | 6/1998 | Nemirofsky ................ 348/13 |
| 5,835,864 A | * | 11/1998 | Diehl et al. ................ 455/6.2 |
| 5,870,155 A | * | 2/1999 | Erlin ...................... 348/734 |
| 5,936,660 A | * | 8/1999 | Gurantz .................... 348/10 |
| 5,973,756 A | | 10/1999 | Erlin ...................... 348/734 |
| 6,069,672 A | * | 5/2000 | Claassen ................... 348/734 |

FOREIGN PATENT DOCUMENTS

| | | | |
|---|---|---|---|
| CA | 2083471 | 9/1994 | |
| DE | 19520180 | 5/1996 | |
| EP | 633661 | * 1/1995 | |
| EP | 0 907 156 | 9/1998 | |
| GB | 2324395 A | 10/1998 | |
| JP | 62067967 | 3/1987 | |
| JP | 2189098 | 7/1990 | |
| WO | WO 95/17793 | 6/1995 | |
| WO | WO96/32702 | 10/1996 | ............ G07F/7/10 |
| WO | WO97/29592 | 8/1997 | ............ H04N/7/10 |
| WO | WO 97/35430 | 9/1997 | |
| WO | WO98/00968 | 1/1998 | ............ H04N/5/44 |
| WO | WO 98/16062 | 4/1998 | |

OTHER PUBLICATIONS

Coustel "Television Tunes in to Smart Cards" Card Technology p 64 Nov. 1996.*

* cited by examiner

Primary Examiner—M. Kemper
(74) Attorney, Agent, or Firm—Ladas & Parry

(57) ABSTRACT

A subscriber unit in a television system including an integrated receiver and decoder (IRD) including a first smart card reader which is operative to accept a first smart card, and a remote control including a second smart card reader which is operative to accept a second smart card. The first smart card and the second smart card, when inserted in the corresponding first and second smart card readers respectively, are operative to communicate with each other in wireless communication over a wireless communication link to control access to services.

25 Claims, 6 Drawing Sheets

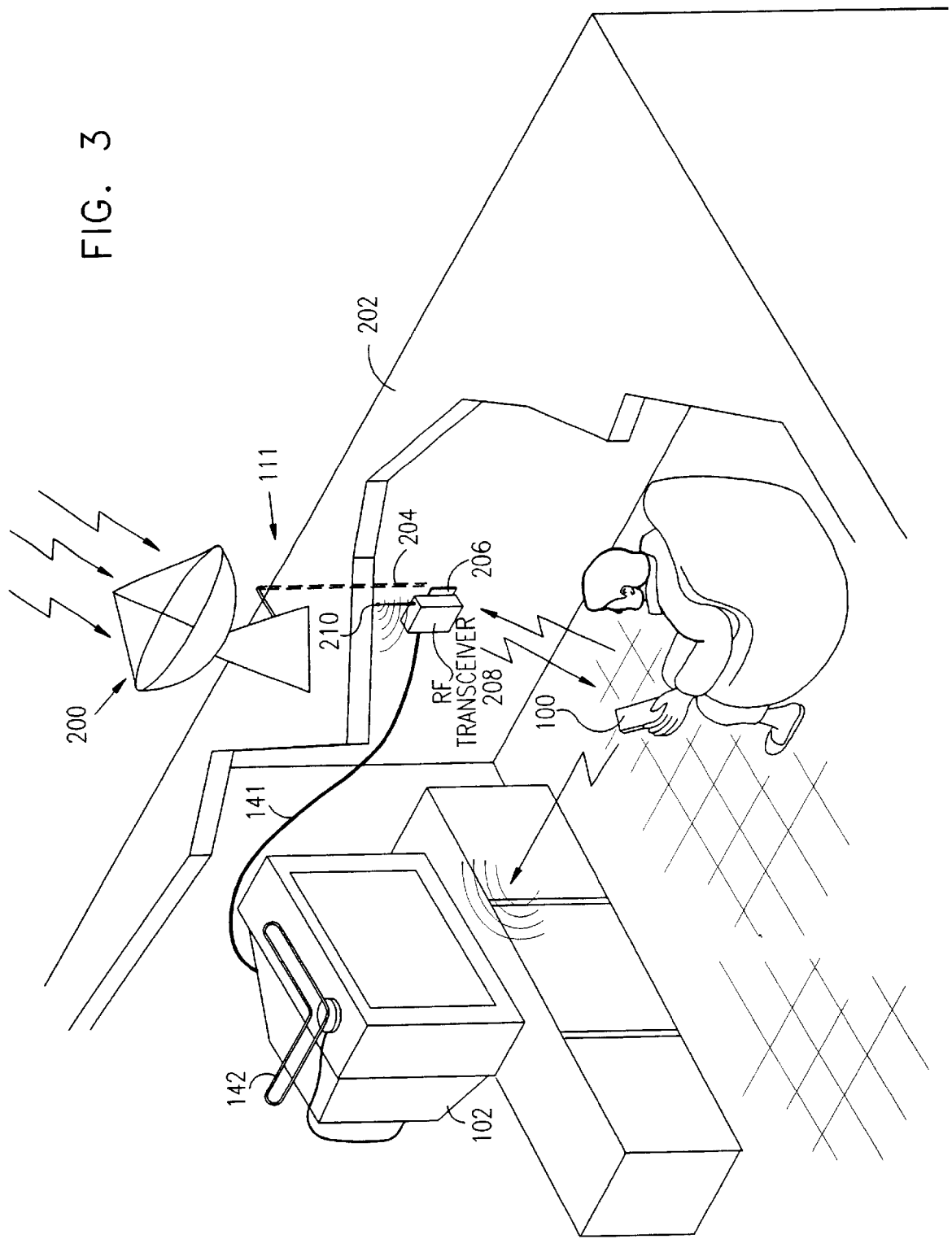

DISTRIBUTED IRD SYSTEM

FIELD OF THE INVENTION

The present invention relates to television systems, and particularly to pay television systems.

BACKGROUND OF THE INVENTION

Typically, pay television programming material is provided via an integrated receiver and decoder (IRD) which receives and decodes pay television transmissions. In some state-of-the-art pay television systems, the programs are encrypted, and a smart card, which is typically inserted in a slot in the IRD, is operative to provide seeds or keys for decryption of the encrypted programs. One example of such a system is described in U.S. Pat. Nos. 5,282,249 and 5,481,609 to Cohen et al.

German Patent application DE 19520180 describes wireless remote control, e.g. for pay-TV system which has an integral reading unit for a carrier in form of IC card that contains information for working a remote control unit and at least one channel for television programs.

Patent application WO 9517793 describes a programming device that uses an integrated smart card reader and an electronic circuit for transferring the programming information obtained from the card to the receiver. The programming information contained on the card may be divided into information packets and relate to the television stations which can be received with a given locality. The smart card reader may be incorporated in a remote control device for the receiver.

Japanese patent application JP 62067967 describes a personal TV receiver which also serves as personal data bank and has programs for IC cards operated via remote control by transmitter to enable one TV set to perform various demands.

Canadian patent application CA 2083471 describes a remote control device that has a first command signal generator for receiving user activation, and in response for it, generating a selected one of a number of first command signals, which signifies a user selected appliance.

Japanese patent application 2189098 describes a multipurpose remote control transmitter which has a device to read transmission data stored in IC card.

U.S. Pat. No. 5,666,412 to Handelman et al describes a CATV system including a CATV network and apparatus for transmitting over the CATV network information to a multiplicity of subscriber units, each including a CATV decoder and an IC card reader and writer coupled to the CATV decoder, the IC card reader and writer includes two separate IC card receptacles, such that IC cards inserted into the two separate IC card receptacles are separately accessed by the IC card reader and writer.

Unpublished Israel patent application 117,547 filed Mar. 18, 1996 and corresponding PCT application No. PCT/IL97/00031, filed Jan. 23, 1997 describe a pay television system including: a pay television network; a subscriber unit which receives pay television transmissions via the pay television network and displays the pay television transmissions on televisions coupled thereto, the subscriber unit including at least two pay television decoders, wherein a first decoder includes a first card reader and a second decoder includes a second card reader; a first smart card which is operative, upon insertion in a first slot in the first card reader, to activate decoding of the pay television transmissions in the first decoder; and a second smart card which is operative, upon insertion in a second slot in the second card reader, to activate decoding of the pay television transmissions in the second decoder, wherein the second smart card is operable to deactivate in accordance with predetermined criteria, and to reactivate upon insertion in the first slot in the first card reader after removal of the first smart card from the first card reader.

U.S. Pat. No. 4,748,668 to Shamir et al describes a method and apparatus for simple identification and signature which enable any user to prove his identity and the authenticity of his messages to any other user.

U.S. Pat. No. 4,933,970 to Shamir describes a method and apparatus which enable an entity to generate proofs of identity and signatures of messages that everyone can verify but no one can forge.

The disclosures of all references mentioned above and throughout the present specification are hereby incorporated herein by reference.

SUMMARY OF THE INVENTION

The present invention seeks to provide television systems having portable devices for receiving program transmissions and/or authorizations.

There is thus provided in accordance with a preferred embodiment of the present invention a subscriber unit in a television system, the subscriber unit including:

an integrated receiver and decoder (IRD) including a first smart card reader which is operative to accept a first smart card; and a remote control including a second smart card reader which is operative to accept a second smart card, wherein the first smart card and the second smart card, when inserted in the corresponding first and second smart card readers respectively, are operative to communicate with each other in wireless communication over a wireless communication link to control access to services.

Further in accordance with a preferred embodiment of the present invention the first smart card, when inserted in the first smart card reader, is operative to control access to at least a first service, and the second smart card, when inserted in the second card reader, is operative to control access to at least a second service, and the first smart card and the second smart card, when both are inserted into the first and second smart card readers respectively, are operative to communicate with each other in wireless communication over the wireless communication link to control access to at least a third service.

Preferably, the access to services includes at least one of the following: authorization for purchase of a restricted television program; authorization for purchase of merchandise; authorization for purchase of information; and authorization for purchase of a service.

Additionally, the access to services may be associated with a PIN of a subscriber.

Preferably, each of the IRD and the remote control includes an encryptor/decrypter which is operative to encrypt/decrypt the wireless communication.

Further preferably, the remote control includes a display and an input device for interacting with a subscriber.

In accordance with a preferred embodiment of the present invention the IRD includes:

an IRD verifier which is coupled to the first smart card reader; and a receiver and decoder unit which is coupled to the IRD verifier and is operative to receive and decode television transmissions provided by the television system, wherein the IRD verifier is operative to accept a first authorization signal from the first smart card, and a second authorization signal from the second smart card via the wireless communication link, and to provide a key for decoding at least part of the television transmissions to the receiver and decoder unit.

Additionally, the remote control includes a remote control verifier which is coupled to the second smart card reader, and the remote control verifier is operative to verify authenticity of the second smart card, to receive the second authorization signal from the second smart card, and to provide the second authorization signal to the IRD verifier via the wireless communication link when authenticity of the second smart card is verified.

Alternatively, the IRD verifier is excluded, and the remote control includes a remote control verifier which is coupled to the second smart card reader, and the remote control verifier is operative to accept a first authorization signal from the first smart card via the wireless communication link, and a second authorization signal from the second smart card, and to provide a key for decoding at least part of the television transmissions to the receiver and decoder unit.

There is also provided, in accordance with a preferred embodiment of the present invention, a portable subscriber unit including:

a receiving antenna for receiving television transmissions;

a receiver and decoder unit which is coupled to the receiving antenna and is operative to receive and decode the television transmissions;

a smart card unit which is operative to provide authorization for viewing the television transmissions via a smart card reader;

a verifier which is coupled to the smart card reader and to the receiver and decoder unit and is operative to accept the authorization for viewing the television transmissions from the smart card and to provide a key for decoding the television transmissions to the receiver and decoder unit;

a transmitting antenna; and a transmitter which is coupled to the transmitting antenna and to the receiver and decoder unit, wherein the receiver and decoder unit is operative to provide to the transmitter decoded television transmissions in response to acceptance of the key, and the transmitter is operative to provide the decoded television transmissions to the transmitting antenna for wireless transmission.

Further in accordance with a preferred embodiment of the present invention the smart card unit is operative to provide the key to the verifier.

Preferably, the receiving antenna and the transmitting antenna are combined in a receive/transmit antenna.

Additionally, the portable subscriber unit includes a multiplexer for multiplexing the decoded television transmissions prior to providing to the transmitter the decoded television transmissions in response to acceptance of the key.

Further additionally, the portable subscriber unit includes a transceiver for transmitting remote control signals to the television via a wireless link.

There is also provided in accordance with another preferred embodiment of the present invention a remote control for use in a television system, the television system including an integrated receiver and decoder (IRD) comprising a first smart card reader which is operative to accept a first smart card, the remote control including wireless communication apparatus operative to establish a wireless communication link with the IRD, and a second smart card reader which is operative to accept a second smart card, wherein the first smart card and the second smart card, when inserted in the corresponding first and second smart card readers respectively, are operative to communicate with each other in wireless communication over the wireless communication link to control access to services.

There is also provided in accordance with another preferred embodiment of the present invention a method for use in a television system, the television system including a remote control and an integrated receiver and decoder (IRD) comprising a first smart card reader which is operative to accept a first smart card, the method including establishing a wireless communication link between the remote control and the IRD, and accepting a second smart card in a second smart card reader in the remote control, wherein the first smart card and the second smart card, when inserted in the corresponding first and second smart card readers respectively, communicate with each other in wireless communication over the wireless communication link to control access to services.

In accordance with a preferred embodiment of the present invention there is also provided an access control method including:

inserting a first smart card in an IRD;

enabling access to a first group of television program transmissions;

inserting a second smart card in a remote control which is in wireless communication with the IRD; and enabling access to a second group of television program transmissions in response to the step of inserting a second smart card in a remote control.

Preferably, the step of enabling access to a first group of television program transmissions includes providing an authorization for purchase of at least one of the following: restricted television programs; merchandise; information; and services.

Further preferably, the step of providing an authorization for purchase includes:

determining a first set of conditions; and providing the authorization for purchase in accordance with the first set of conditions.

Preferably, the first set of conditions includes a first limit.

Further preferably, the step of enabling access to a second group of television program transmissions includes providing an authorization for purchase of at least one of the following: restricted television programs; merchandise; information; and services.

Preferably, the step of providing an authorization for purchase includes:

determining a second set of conditions; and providing the authorization for purchase in accordance with the second set of conditions.

The second set of conditions may include a second limit.

Preferably, each of the first limit and the second limit is programmable.

Additionally, the method also includes the step of enabling decoding of conventional remote control functions in response to the step of inserting a first smart card in an IRD.

There is also provided, in accordance with a preferred embodiment of the present invention, a method for providing television transmissions including:

receiving television transmissions provided by a headend at a portable subscriber unit via an RF wireless communication link;

inserting a smart card in a smart card reader in the portable subscriber unit;

decoding the television transmissions at the portable subscriber unit to generate decoded television transmissions in response to verification of the smart card; and transmitting the decoded television transmissions to a television in response to the verification of the smart card.

Preferably, the receiving step and the transmitting step are provided via a combined receive/transmit antenna.

BRIEF DESCRIPTION OF THE DRAWINGS

The present invention will be understood and appreciated more fully from the following detailed description, taken in conjunction with the drawings in which:

FIG. 3 is a generalized block diagram illustration of a preferred implementation of an intermediate transceiver which is operative with the subscriber unit of FIG. 2;

DETAILED DESCRIPTION OF PREFERRED EMBODIMENTS

Figure 1:
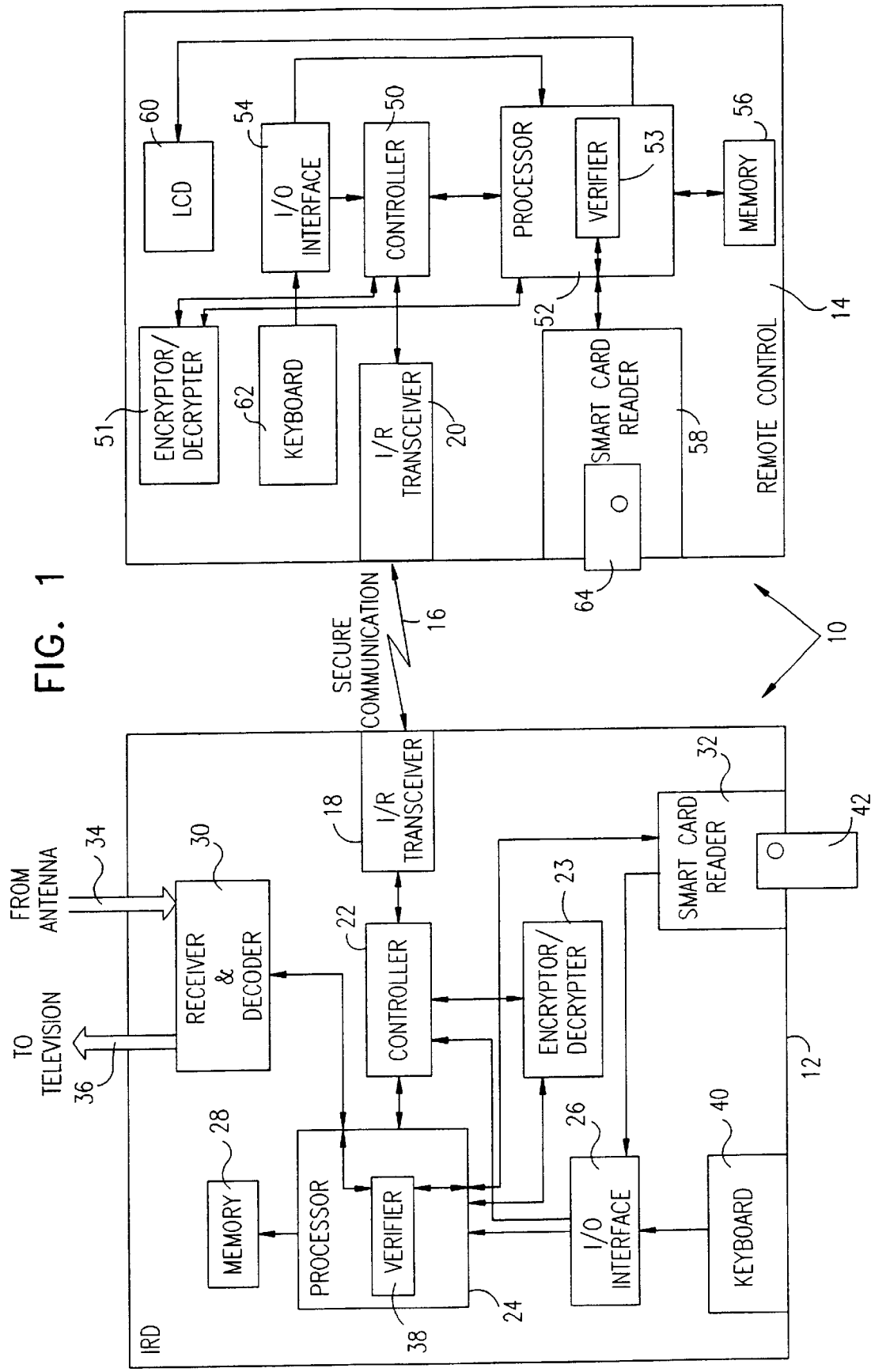
FIG. 1 is a generalized block diagram illustration of a preferred implementation of a subscriber unit in a television system constructed and operative in accordance with a preferred embodiment of the present invention.

Reference is now made to FIG. 1, which is a generalized block diagram illustration of a preferred implementation of a subscriber unit 10 in a television system constructed and operative in accordance with a preferred embodiment of the present invention.

Preferably, the subscriber unit 10 includes an integrated receiver and decoder (IRD) 12 and a remote control 14 which controls the IRD 12 and communicates therewith. The remote control 14 is preferably a portable remote control of the size of conventional remote controls that are used with televisions and video-cassette-recorders (VCRs).

Preferably, communication between the IRD 12 and the remote control 14 comprises secure two-way wireless communication which is carried via a wireless infrared (I/R) link 16. Typically, the secure two-way wireless communication is provided between an infrared transceiver 18 in the IRD 12 and an infrared transceiver 20 in the remote control 14. Infrared transceivers 18 and 20 may be conventional infrared transceivers which are typically used in remotely controlled televisions and VCRs. Alternatively, any other appropriate wireless communication apparatus may be used.

The term "transceiver" is used throughout the specification and claims to include a unit which includes a receiver and a transmitter, preferably in a combined device.

In the IRD 12, the infrared transceiver 18 is coupled to a controller 22 which is coupled to an encryptor/decrypter 23, a processor 24 and an input/output (I/O) interface 26. The controller 22 is preferably operative to prepare signals received from the transceiver 18 in a format suitable for processing by the processor 24, and to prepare signals provided by the processor 24 in a format suitable for transmission by the infrared transceiver 18. It is appreciated that controller 22 may be comprised in of the infrared transceiver 18.

Preferably, encryptor/decrypter 23 is operative to decrypt signals received at the IRD 12 and to encrypt signals generated at the IRD 12 for transmission.

The processor 24 is preferably coupled to a memory 28, to a receiver and decoder unit 30, to the I/O interface 26, and to a reader operative to receive an appropriate removable security element, such as a smart card reader 32. It is appreciated that any appropriate reader operative to receive an appropriate removable security element, such as a smart card as described below, may be used. For purposes of simplicity of description in the present specification and claims the term "smart card" is used throughout when describing an appropriate removable security element, it being appreciated that another appropriate removable security element may alternatively be used.

The receiver and decoder unit 30 is operative to receive and decode television transmissions received from an antenna (not shown) via any appropriate communications medium, such as a coaxial cable 34, and to provide the decoded television transmissions to a television (not shown) via any appropriate communications medium, such as a coaxial cable 36, under control of an IRD verifier 38 which may be comprised in the processor 24, these functions being similar to those well-known in conventional commercially-available IRD units.

The I/O interface 26 is operative to provide an interface between an appropriate user input device, such as a keyboard 40, and the processor 24 and to convert commands entered via the keyboard 40 to a format suitable for processing by the processor 24.

The smart card reader 32 is operative to accept a smart card 42, usually a family card, which is operative to control access to at least part of the television transmissions. Preferably, the smart card reader is coupled to the I/O interface 26, and the smart card 42 may be operative to control reception and decoding of conventional remote control functions provided to the I/O interface 26, such as change of channels and adjustment of volume, contrast and brightness.

The term "family card" is used throughout the specification and claims to include a card which allows access to programs and pay programs which are rated as family programs or children's programs. The family card is also typically used to allow children access for purchase of merchandise or services of low cost.

It is appreciated that smart card 42 provides authorization signals or codes to the IRD verifier 38 via the smart card reader 32. The authorization signals or codes are preferably processed by the IRD verifier 38 which typically provides keys or seeds that are used by the encryptor/decrypter 23 to decode the television transmissions received at the receiver and decoder unit 30 via the antenna as is well known in the art.

Preferably, the authorization signals or the codes may include a personal identification number (PIN) which may be supplied by a subscriber of the television system. The PIN usually includes a series of numbers, or other symbols, which may be entered by pressing keys (not shown) on the keyboard 40.

It is appreciated that processing in the IRD verifier 38 may also include authentication of the smart card 42 using methods well known in the art, such as those described in U.S. Pat. No. 4,748,668 to Shamir et al and in U.S. Pat. Nos. 5,282,249 and 5,481,609 to Cohen et al.

The remote control 14 preferably includes units which are substantially similar to the units that are comprised in the IRD 12. The infrared transceiver 20 is preferably coupled to a controller 50 which is coupled to an encryptor/decrypter 51, a processor 52 and to an I/O interface 54. Preferably, the controller 50, the encryptor/decrypter 51, the processor 52 and the I/O interface 54 may be similar to the controller 22, the encryptor/decrypter 23, the processor 24 and the I/O interface 26 respectively, and may have similar functionality. The processor 52 may preferably include a remote control verifier 53 which is substantially similar to the IRD verifier 38.

Preferably, the encryptor/decrypter 51 is operative to decrypt signals received at the remote control 14 and to encrypt signals generated for transmission at the remote control 14.

The processor 52 is preferably coupled to a memory 56, to a smart card reader 58 and to a display 60, preferably a liquid crystal display (LCD). The I/O interface 54 is preferably coupled to an appropriate user input device, such as a keyboard 62 which may be employed to enter commands and data, such as the PIN of the subscriber as mentioned above. It is appreciated that the memory 56, the smart card reader 58 and the keyboard 62 may be similar to the memory 28, the smart card reader 32 and the keyboard 40 respectively, and may have similar functionality.

Preferably, the smart card reader 58 is operative to accept a smart card 64 which may preferably be a personal card which controls access to selected activities, such as purchases of restricted television transmissions, purchases of merchandise via the television, and access to valuable information.

The term "personal card" is used throughout the specification and claims to include a card which allows access to programs and pay programs which are rated for adults only. The personal card is also used to allow access for purchase of high value merchandise or services, such merchandise and services being typically purchased by adults.

It is appreciated that some other type of first smart card other than a family card may be used, and some other type of second smart card other than a personal card may be used. In general, the first smart card may allow access to a first group of services, the second smart card may allow access to a second group of services, and both the first smart card and the second smart card together may be required to allow access to a third group of services, the third group of services typically including at least one service which is not included in either the first group of services or the second group of services.

Preferably, the secure two-way wireless communication between the IRD 12 and the remote control 14 includes authorizations of activities performed by the subscriber. The authorizations are preferably provided by one of the smart cards 42 and 64 according to a type of authorization required by the subscriber.

If the subscriber purchases a family rated program, the smart card 42 may provide an authorization for purchase of the family rated program to the verifier 38 which authenticates the smart card 42 and generates suitable keys or seeds for decryption of the family rated program if the smart card 42 is authenticated. Preferably, upon purchase of the family rated program, a debit is subtracted from a credit stored in the smart card 42.

If the subscriber purchases an adult rated program, the smart card 64 may provide an authorization for purchase of the adult rated program to the verifier 53 which authenticates the smart card 64 and generates an encrypted authorization signal which is transmitted via the secure two-way communication link 16. Preferably, the encrypted authorization signal may be received and processed at the verifier 38 together with an authorization signal received from the smart card 42.

Each of the encrypted authorization signal and the authorization signal received from the smart card 42 may preferably include a signature, authentication information and a code, such as a PIN, which are processed by the verifier 38 to authenticate the smart cards 42 and 64. If the smart cards 64 and 42 are authenticated, the verifier 38 may preferably transmit an authentication signal combined with a debit signal for debiting the purchase of the adult rated program to the smart card 42, an authentication signal combined with an indication of purchase to the smart card 64, and suitable keys or seeds for decryption of the adult rated program to the receiver and decoder unit 30.

Preferably, the authentication signal, combined with an indication of purchase, is encrypted prior to transmission to the smart card 64 via the secure two-way communication link 16.

Preferably, the smart card 42 may also authorize purchase of services and merchandise in accordance with a first set of conditions which may include, inter alia, selected types of merchandise and services, and a first limit which may comprise, for example, a week's entertainment allowance of a child. It is appreciated that the first limit may be programmable and determined by a parent.

Preferably, the smart card 64 may provide authorization for purchase of programs rated for adults, and purchase of expensive services and merchandise in accordance with a second set of conditions which may include, inter alia, selected types of merchandise and services, and a second limit which may be programmable and determined by the parent.

It is appreciated that the authorization for purchase provided by either the smart card 42 or the smart card 64 may be accompanied by "tokens" which represent credit, debit or balance, and a transfer of tokens may represent a transfer of money. In such a case, the authorization for purchase may also include a credit limit.

Preferably, the smart card 64 may collect and store specific information, such as information related to viewing or purchasing preferences of the subscriber, favorite channel preferences, viewing habits and preferences related to electronic program guide (EPG) suggestions. The specific information may also include authorizations to view premium programs which have been subscribed to, not based on payment for viewing.

It is appreciated that the specific information may be combined with the authentication signal, the indication of purchase, and the tokens and transmitted to the IRD 12 via the secure two-way communication link 16. Preferably, the IRD 12 may process the specific information and use it to make useful offers for viewing or offers for purchase to the subscriber. Preferably, part of the information may be provided to a broadcaster of the television transmissions.

In a preferred embodiment of the present invention only one of the verifiers 38 and 53 may be employed. In such a case, if the verifier 38 is employed and the verifier 53 is excluded, the verifier 38 may perform the functions of both the verifiers 38 and 53, and authorization and authentication information from the smart card 64 is transmitted to the verifier 38 via the secure two-way communication link 16.

If the verifier 53 is employed and the verifier 38 is excluded, the verifier 53 may perform the functions of both the verifiers 38 and 53, and authorization and authentication information from the smart card 42 is transmitted to the verifier 53 via the secure two-way communication link 16.

In a preferred embodiment of the present invention the IRD 12 is not operative to decode any television transmissions without the smart card 42. Additionally, in another preferred embodiment of the present invention, decoding of conventional remote control functions, such as change of channels and adjustment of volume, contrast and brightness, may be prevented if the smart card 42 is not inserted in the smart card reader 32.

However, if the smart card 42 is inserted in the smart card reader 32, but the smart card 64 is not inserted in the smart card reader 58 in the remote control 14, the IRD 12 may be operative to decode family rated programs and children rated programs, and to enable purchase of services and merchandise up to the first limit. In such a case, the subscriber may use the remote control 14 in a conventional way to control various conventional functions of the IRD 12, such as change of channels and adjustment of volume, contrast and brightness.

For the purposes of the present specification and claims, the terms "encode/decode" in all of their forms are used to include all appropriate forms of data encoding/decoding, ranging from simple encoding/decoding or scrambling/descrambling to hard encryption/decryption.

Figure 2:
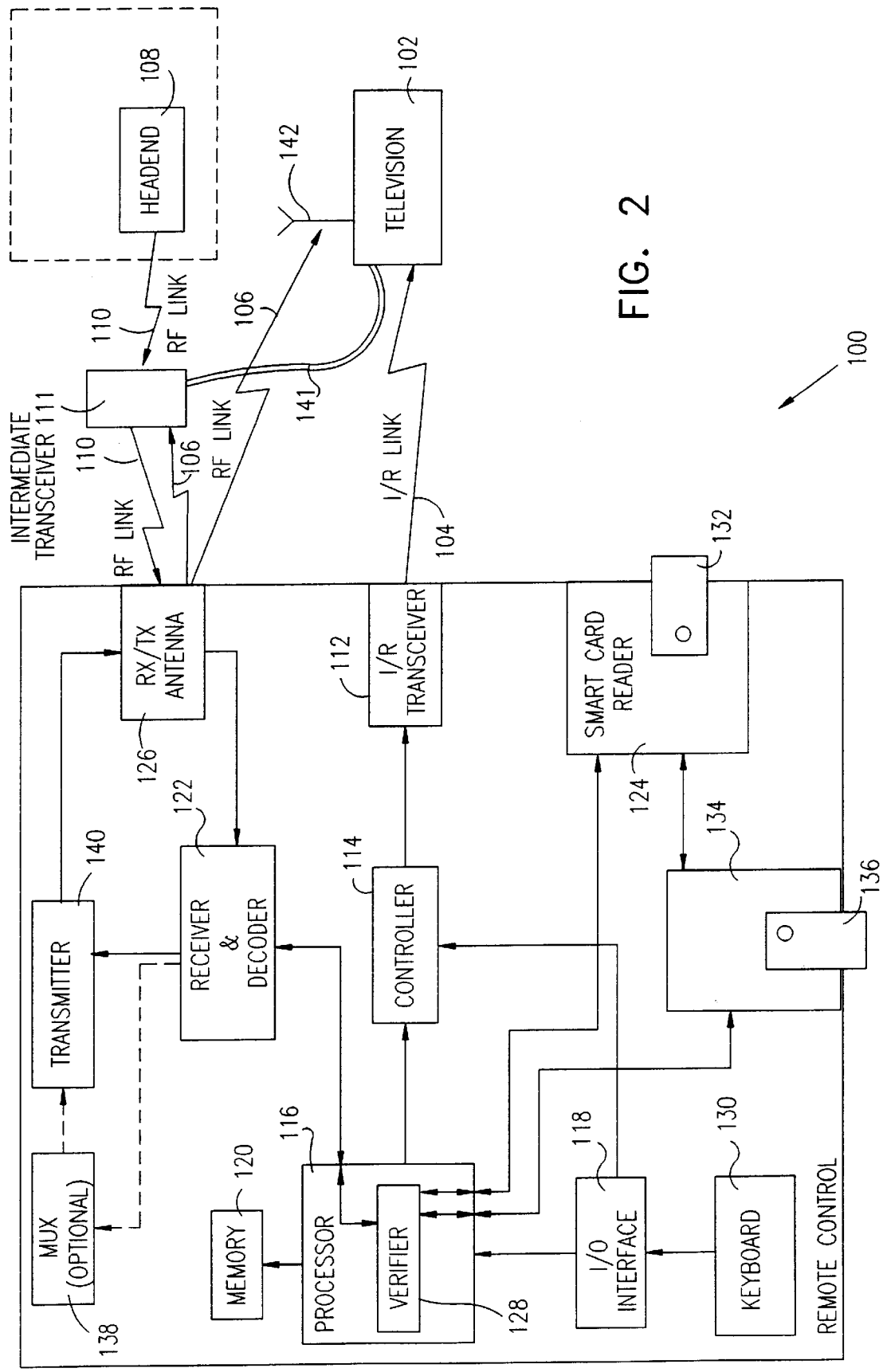
FIG. 2 is a generalized block diagram illustration of a preferred implementation of a subscriber unit in a television system constructed and operative in accordance with another preferred embodiment of the present invention.

Reference is now made to FIG. 2, which is a generalized block diagram illustration of a preferred implementation of a subscriber unit 100 in a television system constructed and operative in accordance with another preferred embodiment of the present invention.

Preferably, the subscriber unit 100 comprises a portable subscriber unit that transmits remote control signals to a television 102 via a wireless infrared link 104 and provides television transmissions to the television 102 via a wireless radio-frequency (RF) link 106.

Preferably, the television transmissions are received at an intermediate transceiver 111 from a headend 108 via a wireless RF link 110. Then, the intermediate transceiver 111 transmits the television transmissions received thereat to the subscriber unit 100 via the wireless RF link 110. A preferred implementation of the intermediate transceiver 111 is described herein with reference to FIG. 3.

It is appreciated that communication via the infrared link 104 preferably includes wireless, one-way communication which is provided by an infrared transceiver 112 in the subscriber unit 100. Preferably, the infrared transceiver 112 is coupled to a controller 114 which is coupled to a processor 116 and to an I/O interface 118.

The controller 114 is preferably operative to prepare signals received from the infrared transceiver 112 in a format suitable for processing by the processor 116. It is appreciated that controller 114 may be comprised in the infrared transceiver 112.

Preferably, the processor 116 is coupled to a memory 120, to a receiver and decoder unit 122, to the I/O interface 118, and to a smart card reader 124. The receiver and decoder unit 122 is operative to receive and decode the television transmissions received from the headend 108 via the wireless RF link 110 and via an antenna 126. It is appreciated that the receiver and decoder unit 122 typically operates under control of a verifier 128 which may be part of the processor 116.

The I/O interface 118 is operative to provide an interface between an appropriate user input device, such as a keyboard 130, and the processor 116 and to convert commands entered via the keyboard 130 to a format suitable for processing by the processor 116.

The smart card reader 124 is operative to accept a smart card 132, usually a family card which is operative to control access to at least part of the television transmissions. It is appreciated that subscriber unit 100 may include an additional smart card reader 134 which may be operative to accept a personal smart card 136, which may be similar to the smart card 64. Preferably, the smart card reader 134 may be coupled to the smart card reader 124 and to the processor 128, and may communicate authorization signals or authorization codes therewith.

Preferably, the smart card 132 or the smart card 136 may provide an authorization signal or an authorization code for purchase via the television system. Preferably, the authorization signal or code is provided to the verifier 128 via the smart card reader 124 or via the smart card reader 134 respectively.

It is appreciated that the authorization for purchase provided by either the smart card 132 or the smart card 136 may be accompanied by signals indicating "tokens" which represent credit, debit or balance, and a transfer of tokens may represent a transfer of money. In such a case, the authorization for purchase may also include a signal indicating a credit limit.

Preferably, the verifier 128 provides the receiver and decoder unit 122 a key or a seed which is employed by the receiver and decoder unit 122 to decode the television transmissions. Preferably, the receiver and decoder unit 122 outputs decoded television signals to a transmitter 140.

It is appreciated that in some applications the television transmissions may include a combination of video information and data, such as in a case where multimedia information is transmitted, or a combination of video information from various sources, such as in a case where program guide information is transmitted. In such cases, the receiver and decoder unit 122 may preferably provide data and video information separated thereat to a multiplexer (MUX) 138, which multiplexes the decoded television signals to provide a multiplexed television signal which is combined with a carrier signal in a transmitter 140.

Preferably, the transmitter 140 provides the television signals, which may be either non-multiplexed or multiplexed, to the antenna 126 which may be a conventional receive and transmit antenna. The antenna 126 preferably transmits the television signals, over the RF link 106, to the intermediate transceiver 111. In a case where the television signals comprise multiplexed television signals, the intermediate transceiver 111 preferably demultiplexes the multiplexed television signals. The intermediate transceiver 111 provides non-multiplexed or demultiplexed television signals to the television 102 via a cable 141.

Alternatively, the antenna 126 transmits the non-multiplexed or multiplexed television signals over the RF link 106 directly to an antenna 142 which is coupled to the television 102. Multiplexed signals received at the television 102 are preferably demultiplexed at the television 102 and displayed thereon, while non-multiplexed signals are displayed, typically as received, on the television 102.

It is appreciated that signals transmitted over the RF link 106 may comprise analog and/or digital signals, and that the television 102 may be capable of receiving analog and/or digital signals. Preferably, appropriate analog/digital conversion equipment (not shown) is provided, typically as part of the intermediate transceiver 111, to ensure that an acceptable type of signal is received by the television 102.

Reference is now made to FIG. 3 which is a generalized block diagram illustration of a preferred implementation of the intermediate transceiver 111 which is operative with the subscriber unit 100.

Preferably, the intermediate transceiver 111 includes an antenna assembly 200 which is preferably mounted on a roof of subscriber premises 202, or at any suitable location outside the subscriber premises 202. The antenna assembly 200 preferably comprises a satellite reception antenna which is operative to receive television transmissions from a satellite. Alternatively, the antenna assembly 200 may preferably include a reception antenna which is operative to receive television transmissions from a ground based television transmitter. Further alternatively, the antenna assembly 200 may comprise a cable connection operative to receive television signals transmitted via cable.

Preferably, the antenna assembly 200 is connected, via any appropriate communications medium, such as a coaxial cable 204, to an antenna wall outlet 206. Preferably, an RF transceiver 208 is inserted into the wall outlet 206 and is electrically coupled thereto. The RF transceiver 208 may typically comprise an appropriate spread spectrum transceiver or any other appropriate RF transceiver, chosen typically in accordance with bandwidth requirements and applicable licensing regulations.

The RF transceiver 208 preferably receives the television transmissions received at the antenna assembly 200 via the coaxial cable 204 and the wall outlet 206, and transmits the television transmissions received thereat via an antenna 210.

Preferably, the television transmissions provided by the RF transceiver 208 may be received at any location in the subscriber premises 202, and thus, the subscriber unit 100 held by a user may be operative to receive the television transmissions transmitted by the RF transceiver 208.

Upon reception of the television transmissions at the subscriber unit 100, the television transmissions are preferably processed and decrypted in the manner mentioned above with reference to FIG. 2, and preferably transmitted to the intermediate transceiver 111. The intermediate transceiver 111 preferably provides the television transmissions to the television 102 via the cable 141, or, alternatively, to the antenna 142. The television transmissions received at the television 102, either via the cable 141 or from the antenna 142, are typically displayed on the television 102.

Figure 4A:
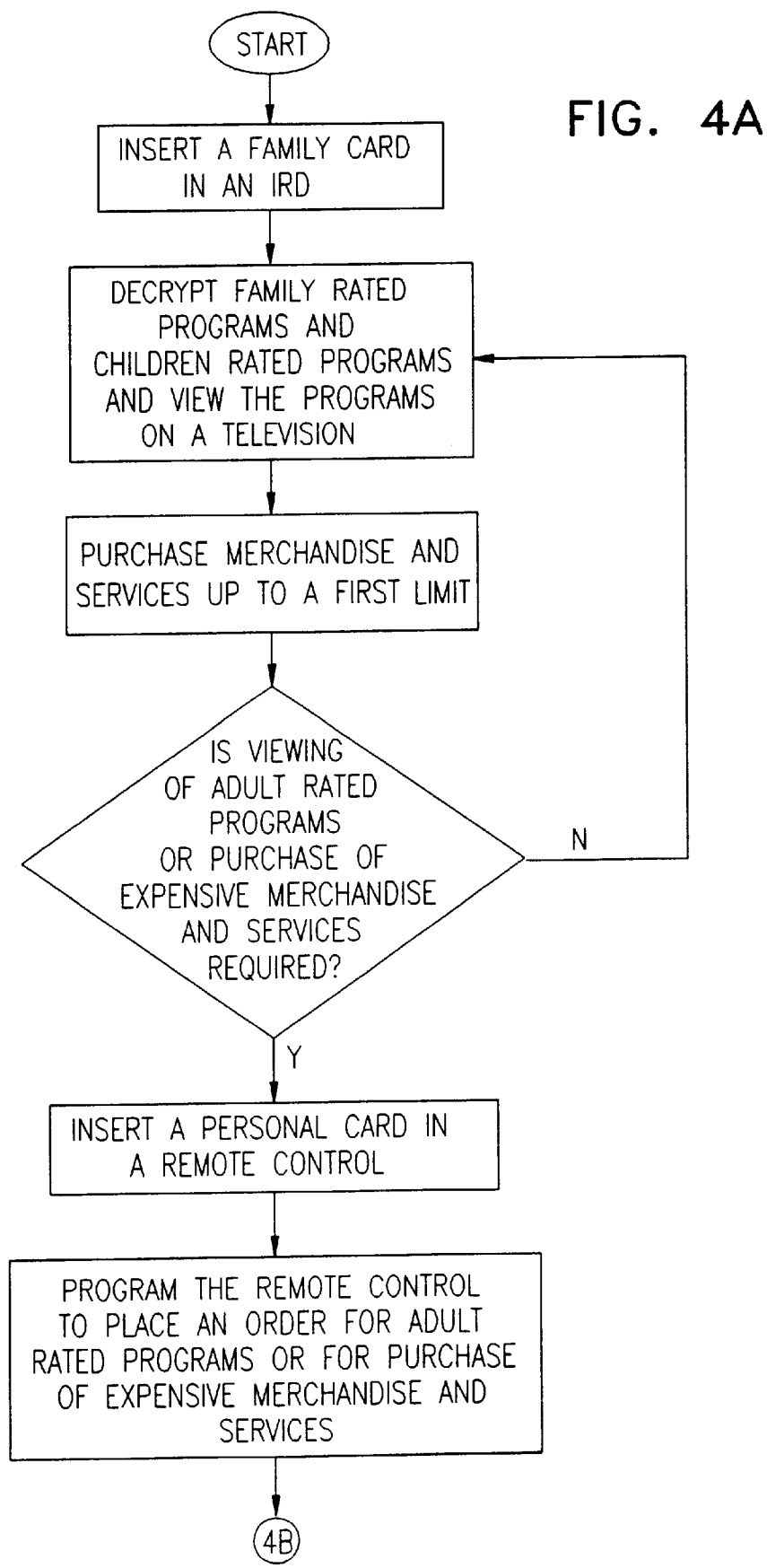
FIGS. 4A and 4B together constitute a flow chart illustrating a preferred method, operative with the subscriber unit of FIG. 1, for controlling access to television transmissions.
Figure 4B:
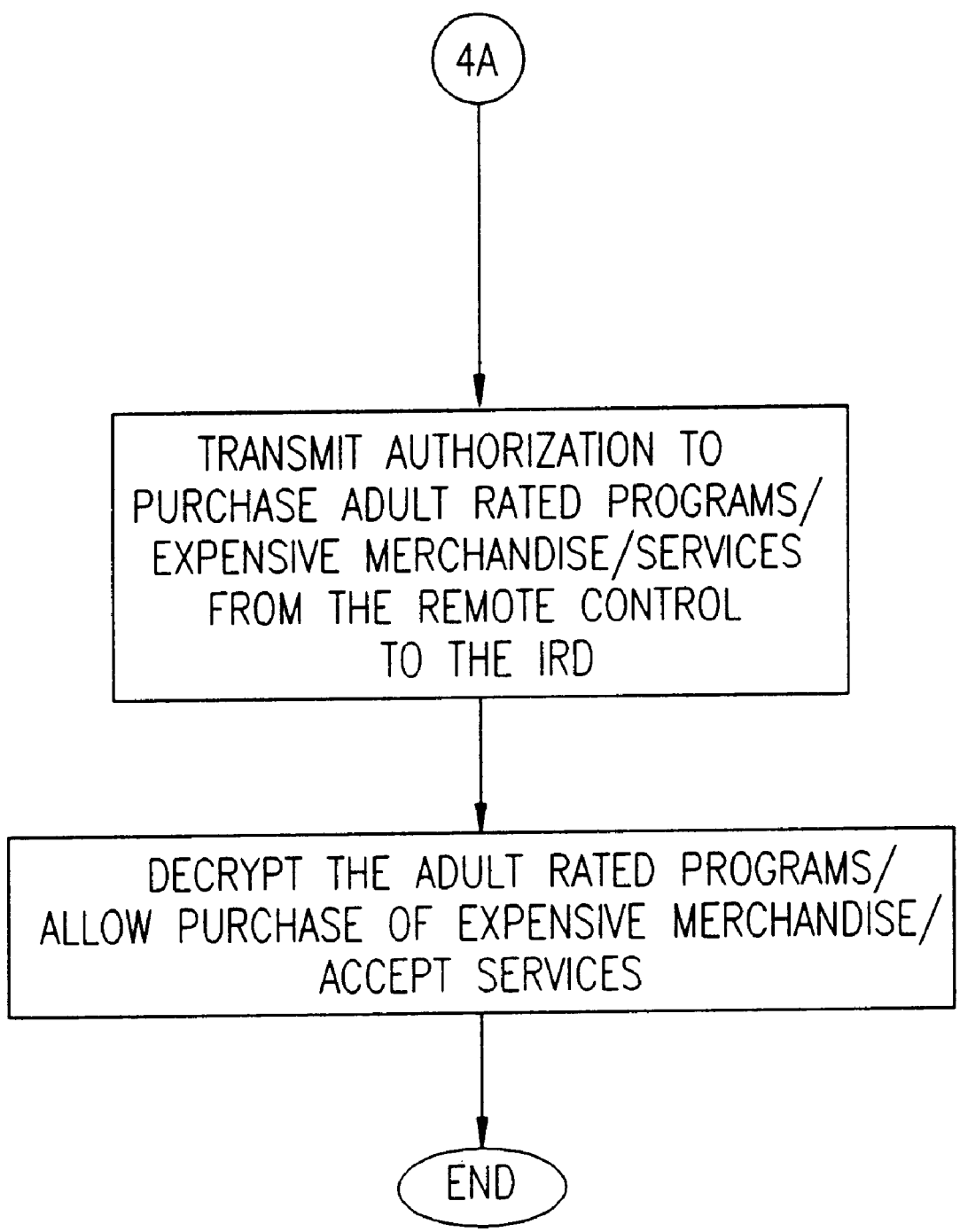

Reference is now made to FIGS. 4A and 4B which together constitute a flow chart illustrating a preferred method for controlling access to television transmissions which is operative with the subscriber unit 10.

Preferably, a subscriber inserts a family card in the IRD 12. When the family card is inserted in the IRD 12, family rated programs and children rated programs may be decrypted and displayed in an intelligible form on a television. Additionally, the subscriber may place orders for services, such as purchase of merchandise, participation in games and access to selected information.

In a preferred embodiment of the present invention the subscriber may program the processor 24 of IRD 12 to accept orders for services and orders for television programs up to an accumulated limit, which may be the first limit as mentioned before. Preferably, the subscriber may use the remote control 14 to program the processor 24. It is appreciated that the first limit may be periodical, so that the first limit is determined for a selected time period, such as a week.

If the subscriber is interested in purchasing restricted television programs, such as adult rated programs, and premium services, such as purchase of expensive services, the subscriber preferably inserts a personal card in the remote control 14. In a preferred embodiment of the present invention, only when the family card and the personal card are inserted in the smart card readers 32 and 58 respectively the restricted television programs are decrypted and displayed in an intelligible form on the television, and orders for the premium services may be placed.

It is appreciated that the subscriber may use the remote control 14 to program a limit for purchase of premium services and restricted television programs, such as the second limit as mentioned before. The second limit may be periodical, so that the second limit is determined for a selected time period, such as a month.

In a preferred embodiment of the present invention the family card and the personal card may exchange information via the secure wireless communication link 16. Preferably, the information may include exchange of keys, authentication messages, parental control restriction codes and verification and validation information. The information may also include exchange of tokens which may represent credit for purchases, debit for services ordered or accounting balance.

Figure 5:
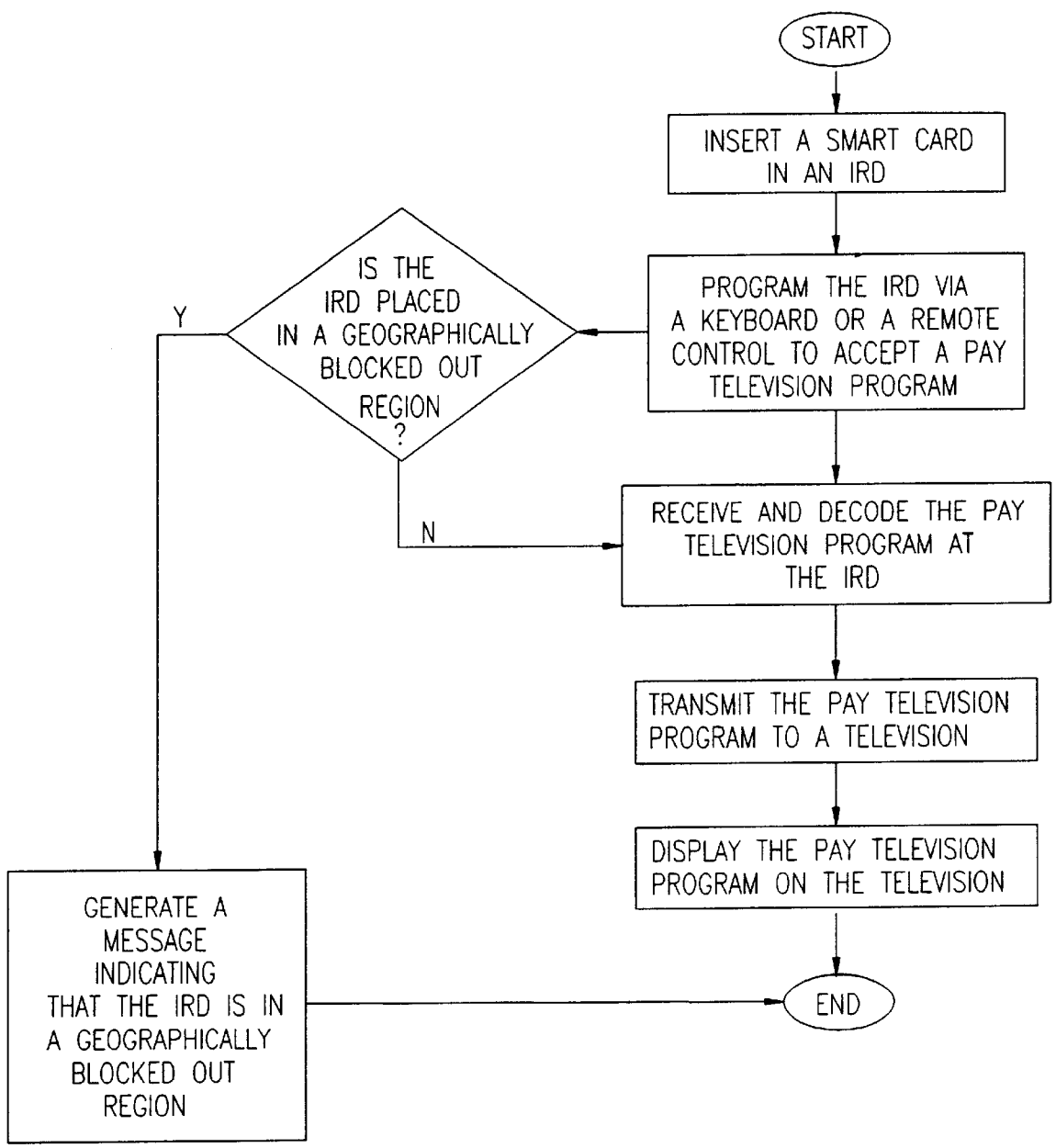
FIG. 5 is a flow chart illustrating a preferred method, operative with the subscriber unit of FIG. 2, for controlling access to television transmissions.

Reference is now made to FIG. 5 which is a flow chart illustrating a preferred method for controlling access to television transmissions which is operative with the portable subscriber unit 100.

Preferably, a subscriber inserts a family card in the portable subscriber unit 100. When the family card is inserted in the subscriber unit 100, programs are received via the wireless RF link 110 and decrypted in the portable subscriber unit 100. Then, the decrypted programs are transmitted to the television 102 and are displayed thereon.

It is appreciated that if the portable subscriber unit 100 includes two smart card readers as mentioned above with reference to FIG. 2, the subscriber may use a family card together with a personal card as mentioned above with reference to FIGS. 4A and 4B.

In a preferred embodiment of the present invention the family card and the personal card may also provide area codes which may be employed to block certain transmissions at selected geographical areas, and supplier codes which may be employed to block services from selected suppliers. The area codes and the supplier codes may be processed in the processor 116 and may be employed to prevent decryption of selected programs.

It is appreciated that various features of the invention which are, for clarity, described in the contexts of separate embodiments, may also be provided in combination in a single embodiment. Conversely, various features of the invention which are, for brevity, described in the context of a single embodiment, may also be provided separately or in any suitable sub-combination.

It will be appreciated by persons skilled in the art that the present invention is not limited by what has been particularly shown and described hereinabove. Rather the scope of the present invention is defined by the claims which follow.

What is claimed is:

1. A subscriber unit in a television system comprising:
    an integrated receiver and decoder (IRD) comprising a first smart card reader which is operative to accept a first smart card;

a remote control comprising a second smart card reader which is operative to accept a second smart card that is operative to generate an authorization signal authorizing access to services;

a two-way wireless IRD communicator operative to enable two-way wireless communication between the first smart card and the second smart card over a wireless communication link when the first smart card and the second smart card are inserted in the corresponding first and second smart card readers respectively; and an IRD verifier operatively associated with the first smart card reader and the two-way wireless IRD communicator and operative to receive from the second smart card via the two-way wireless IRD communicator said authorization signal authorizing access to services and to enable access to said services in response to reception of said authorization signal wherein each of said IRD and said remote control include an encryptor/decryptor which encrypts/decrypts said wireless communication between the first smart card and the second smart card.

2. Apparatus according to claim 1 wherein the first smart card, when inserted in the first smart card reader, is operative to control access to at least a first service, and the second smart card, when inserted in the second card reader, is operative to control access to at least a second service, and the first smart card and the second smart card, when both are inserted into the first and second smart card readers respectively, are operative to communicate with each other via the two-way wireless IRD communicator in two-way wireless communication over the wireless communication link to control access to at least a third service.

3. A subscriber unit according to claim 1 and wherein said access to services comprises at least one of the following: authorization for purchase of a restricted television program; authorization for purchase of merchandise; authorization for purchase of information; and authorization for purchase of a service.

4. A subscriber unit according to claim 1 and wherein said access to services is associated with a PIN of a subscriber.

5. A subscriber unit according to claim 1 and wherein said remote control includes a display and an input device for interacting with a subscriber.

6. A subscriber unit according to claim 1 and wherein said IRD includes:

a receiver and decoder unit which is operatively associated with said IRD verifier and is operative to receive and decode television transmissions provided by said television system, wherein said IRD verifier is operative to accept a first authorization signal from said first smart card, and a second authorization signal from said second smart card via said two-way wireless IRD communicator over said wireless communication link, and to provide a key for decoding at least part of said television transmissions to said receiver and decoder unit.

7. A subscriber unit according to claim 6 and wherein said remote control includes a remote control verifier which is coupled to said second smart card reader, and said remote control verifier is operative to verify authenticity of the second smart card, to receive said second authorization signal from said second smart card, and to provide said second authorization signal to said IRD verifier via said two-way wireless IRD communicator over said wireless communication link when authenticity of said second smart card is verified.

8. A subscriber unit according to claim 1 and wherein said remote control includes a remote control verifier which is coupled to said second smart card reader, and said remote control verifier is operative to accept a first authorization signal from said first smart card via said two-way wireless IRD communicator over said wireless communication link, and a second authorization signal from said second smart card, and to provide a key for decoding at least part of television transmissions to a receiver and decoder unit comprised in said IRD.

9. A remote control for use in a television system, the television system comprising an integrated receiver and decoder (IRD) comprising an encryptor/decryptor and first smart card reader which is operative to accept a first smart card, the remote control comprising:

a two-way wireless remote-control (RC) communication apparatus operative to establish a two-way wireless communication link with the IRD;

a second smart card reader which is operative to accept a second smart card that is operative to generate an authorization signal authorizing access to services;

an encryptor/decryptor which encrypts wireless communications to the IRD operating with the first smart card and decrypts wireless communications from the IRD;

a remote control verifier operatively associated with the two-way wireless RC communication apparatus and the second smart card reader and the encrypter/decrypter and operative to receive an encrypted said authorization signal from the second smart card, to authenticate the second smart card, and to transmit said authorization signal to the IRD over the wireless communication link in response to authentication of the second smart card thereby enabling access to said services.

10. A method for use in a television system, the television system comprising a remote control and an integrated receiver and decoder (IRD) comprising a first smart card reader which is operative to accept a first smart card, and an encrypter/decrypter the method comprising:

establishing a two-way wireless communication link between the remote control and the IRD;

accepting, in a second smart card reader in the remote control, a second smart card which is operative to generate an authorization signal authorizing access to services;

receiving said authorization signal generated by the second smart card;

authenticating the second smart card; encrypting said authorization signal; and transmitting said encrypted authorization signal to the IRD operating with said first smartcard over the wireless communication link in response to said authenticating and receiving for enabling access to said services.

11. An access control method comprising:

inserting a first smart card in an IRD;

enabling access to a first group of television program transmissions;

inserting a second smart card in a remote control which is in two-way wireless communication with the IRD;

generating, in the second smart card, an authorization signal authorizing access to a second group of television program transmissions;

authenticating the second smart card; encrypting said authorization signal;

transmitting said encrypted authorization signal to the IRD;

enabling access to said second group of television program transmissions in response to said generating, authenticating encrypting and transmitting; and wirelessly communicating in two-way wireless communication between the first smart card and the second smart card, when the first smart card is inserted in the IRD and the second smart card is inserted in the remote control, so as to enable access to a third group of television program transmissions.

12. An access control method according to claim 11 and wherein said step of enabling access to a first group of television program transmissions comprises providing an authorization for purchase of at least one of the following: restricted television programs; merchandise; information; and services.

13. An access control method according to claim 12 and wherein said step of providing an authorization for purchase comprises:

determining a first set of conditions; and providing said authorization for purchase in accordance with said first set of conditions.

14. An access control method according to claim 13 and wherein said first set of conditions comprises a first limit.

15. An access control method according to claim 4 and wherein said step of enabling access to said second group of television program transmissions comprises providing an authorization for purchase of at least one of the following: restricted television programs; merchandise; information; and services.

16. An access control method according to claim 15 and wherein said step of providing an authorization for purchase comprises:

determining a second set of conditions; and providing said authorization for purchase in accordance with said second set of conditions.

17. An access control method according to claim 16 and wherein said second set of conditions comprises a second limit.

18. An access control method according to claim 14 and wherein said first limit is programmable.

19. An access control method according to claim 17 and wherein said second limit is programmable.

20. An access control method according to claim 11 and also comprising the step of enabling decoding of conventional remote control functions in response to said step of inserting a first smart card in an IRD.

21. A subscriber unit according to claim 1 and wherein said two-way wireless IRD communicator comprises an infrared (IR) transceiver.

22. A subscriber unit according to claim 1 and wherein said IRD verifier is also operative to receive from the second smart card via the two-way wireless IRD communicator at least one of the following: information related to at least one viewing or purchasing preference of a subscriber; information related to at least one favorite channel preference of the subscriber; information related to viewing habits of the subscriber; subscriber preferences related to electronic program guide (EPG) suggestions; and at least one authorization to view at least one premium program which has been subscribed to, not based on payment for viewing.

23. A remote control according to claim 9 and wherein said two-way wireless RC communication apparatus comprises an IR transceiver.

24. A remote control according to claim 9 and wherein said remote control verifier is also operative to receive from the second smart card at least one of the following: information related to at least one viewing or purchasing preference of a subscriber; information related to at least one favorite channel preference of the subscriber; information related to viewing habits of the subscriber; subscriber preferences related to electronic program guide (EPG) suggestions; and at least one authorization to view at least one premium program which has been subscribed to, not based on payment for viewing.

25. A method according to claim 10 and wherein said receiving also comprises:

receiving from the second smart card at least one of the following: information related to at least one viewing or purchasing preference of a subscriber; information related to at least one favorite channel preference of the subscriber; information related to viewing habits of the subscriber; subscriber preferences related to electronic program guide (EPG) suggestions; and at least one authorization to view at least one premium program which has been subscribed to, not based on payment for viewing; and said transmitting also comprises transmitting to the IRD over the wireless communication link at least one of the following: said information related to at least one viewing or purchasing preference of the subscriber; said information related to at least one favorite channel preference of the subscriber; said information related to viewing habits of the subscriber; said subscriber preferences related to electronic program guide (EPG) suggestions; and said at least one authorization to view at least one premium program which has been subscribed to, not based on payment for viewing.

* * * * *